United States Patent
Cho

[19]

[11] Patent Number: 5,834,830
[45] Date of Patent: Nov. 10, 1998

[54] LOC (LEAD ON CHIP) PACKAGE AND FABRICATING METHOD THEREOF

[75] Inventor: Jae Weon Cho, Choongchungbook-Do, Rep. of Korea

[73] Assignee: LG Semicon Co., Ltd., Cheongju, Rep. of Korea

[21] Appl. No.: 588,789

[22] Filed: Jan. 19, 1996

[30]   Foreign Application Priority Data

Dec. 18, 1995  [KR]   Rep. of Korea ............... 51426/1995

[51] Int. Cl.⁶ .................. H01L 23/495; H01L 23/22; H01L 23/24; H01L 28/28
[52] U.S. Cl. ................. 257/667; 257/687; 257/787; 257/666
[58] Field of Search ................ 257/676, 666, 257/667, 792, 669, 687, 787, 788

[56]   References Cited

U.S. PATENT DOCUMENTS 5,583,375  12/1996  Tsubosaki et al. ............ 257/692
5,585,600  12/1996  Froebel et al. ............... 257/667

FOREIGN PATENT DOCUMENTS 60-165742  8/1985  Japan ..................... 257/667
3-22465    1/1991  Japan ..................... 257/792

*Primary Examiner*—Mahshid D. Saadat
*Assistant Examiner*—Jhihan B. Clark
*Attorney, Agent, or Firm*—Fleshner & Kim

[57]   ABSTRACT

An LOC semiconductor package includes: a semiconductor chip; a plurality of two-sided tapes being attached on predetermined portions of the semiconductor chip inthe form of layers; a lead frame having a step coverage corresponding to the form of the two-sided tape; wires electrically connecting inner leads of the lead frame to pads of the semiconductor chip; and a coating fluid for covering the semiconductor chip, the lead frame and the wires. Its fabricating method includes the steps of: forming an LOC lead frame having dam bars for a chip size package; attaching a plurality of two-sided tapes on the dam bars of the lead frame in the form of layers; attaching a semiconductor chip onto an uppermost layer of said plurality of two-sided tapes; wire-bonding a pad of the semiconductor chip to respective inner leads of the lead frame by using a conductive means; and potting to inject a coating fluid into the lead frame. By employing the LOC package and its fabricating method, the fabricating process can be simplified and its production cost can be reduced.

15 Claims, 2 Drawing Sheets

LOC (LEAD ON CHIP) PACKAGE AND FABRICATING METHOD THEREOF

BACKGROUND OF THE INVENTION

1. Field of the Invention

The present invention relates to a an LOC (Lead On Chip) package and a fabricating method thereof adopting a coating process to reduce the area taken up by a molding resin.

2. Description of the Prior Art

Recently, according to a tendency of enlargement in chip size, an LOC (Lead On Chip) structure is being developed to increase an occupation area of the chip, which is inevitably required.

For a brief explanation of LOC packaging, conventionally, the normal package has an inner structure whereby an adhesive material for die attaching is mounted on a paddle of a lead frame, on which a semiconductor chip is mounted and wire-bonded. Comparatively, the LOC package has a structure that a polyimide tape both surfaces of which are coated with an adhesive material is mounted on a semiconductor chip, to which the inner leads of a lead frame are mounted and wire-bonded.

For instance, a conventional LOC package has the following structure. First, a lead frame as shown in FIG. 1 is used for the conventional LOC package.

Reference numeral 1 denotes a guide rail. A plurality of lead frames 10 are formed spaced within the pair of guide rails 1. And, a plurality of two-sided adhesive tapes 3 are attached to the inner leads 2 of each lead frame 10. A semiconductor chip 4 is attached on the two-sided adhesive tape 3. Bonding pads (not shown) of the semiconductor chip 4 are electrically connected to the inner leads 2 by using bonding wire 5.

The semiconductor chip 4, the inner leads 2 and the wires 5 are sealed by an encapsulating resin 6, as shown in FIG. 2. And then, dam bars 8 and the guide rails 1 of the lead frame 10 are trimmed and outer leads 9 (referring to FIG. 2) are formed, so as to complete formation of the LOC package.

However, as to the LOC package as constructed above, since, after it is sealed with a resin molding, the guide rails and the dam bars of the lead frame are trimmed and the outer leads are formed, its overall process becomes complicated. In addition, a transfer molding needs to be performed, requiring equipment having an additional tray, disadvantageously resulting in an increase in production cost.

SUMMARY OF THE INVENTION

Therefore, an object of the present invention is to provide an LOC semiconductor package and a fabrication method therefor capable of reducing a unit cost of the package and of simplifying the manufacturing process by adopting a coating process without requiring a trimming/forming step nor a resin sealing step.

In order to attain the above object, there is provided an LOC semiconductor package including a semiconductor chip; first two-sided tapes attached to the semiconductor chip at first and third end portions of the semiconductor chip, wherein the first and third end portions of the semiconductor chip are respectively in opposite sides; second two-sided tapes attached to the first two-sided tapes; a lead frame having a step that includes a plurality of first portions and second portions, and being upwardly bent from the first portions to the second portions attached to the first and second two-sided tapes; a plurality of wires connecting the semiconductor chip to the first portions of the lead frame, respectively; insulating films attached to the semiconductor chip at second and fourth end portions of the semiconductor chip, wherein the second and fourth end portions are respectively in opposite sides; and a coating fluid covering a portion of the semiconductor chip, the first portions of the lead frame, and a portion of the second two-sided tapes and the wires.

In order to obtain the above object, there is also provided a method for fabricating an LOC package including the steps of: forming an LOC lead frame having a step including a plurality of first portions and second portions and being upwardly bent from first portions to second portions; attaching second two-sided tapes to the second base part of the lead frame and first two-sided tapes to the first base part of the lead frame and upper surfaces of the second two-sided tapes; attaching a semiconductor chip to second two-sided tapes; wire-bonding a plurality of pads of the semiconductor chip to the plurality of first portions of the lead frame, respectively; and potting to inject a coating fluid into the lead frame.

DETAILED DESCRIPTION OF THE INVENTION

Figure 1:
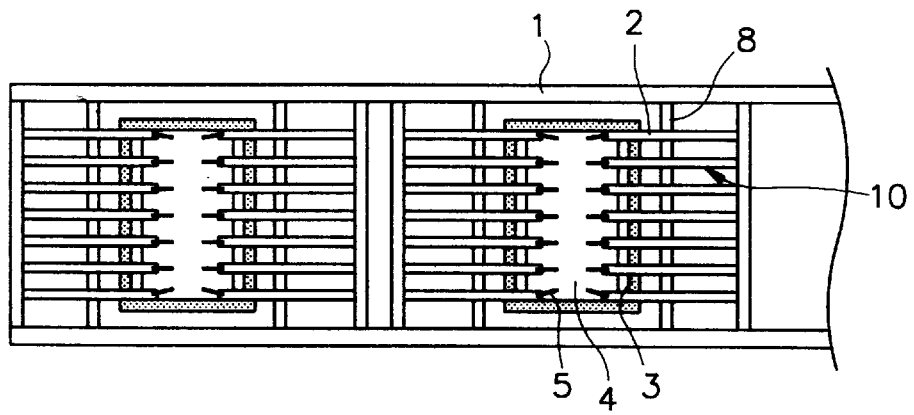
FIG. 1 is a plan view of a lead frame of a conventional LOC package.
Figure 2:
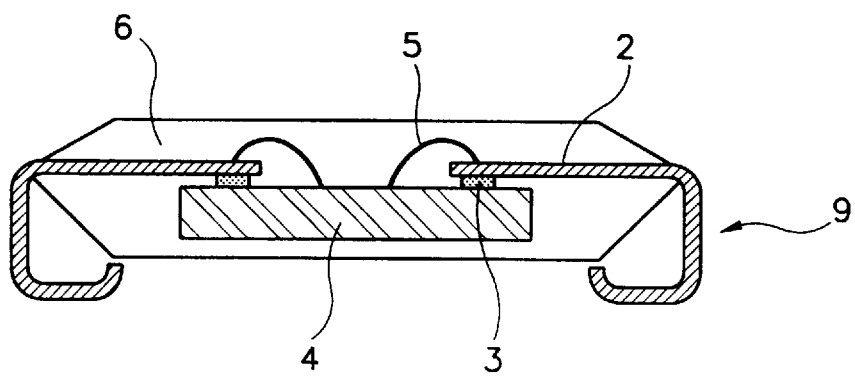
FIG. 2 is a schematic cross-sectional view of the conventional LOC package.
Figure 3:
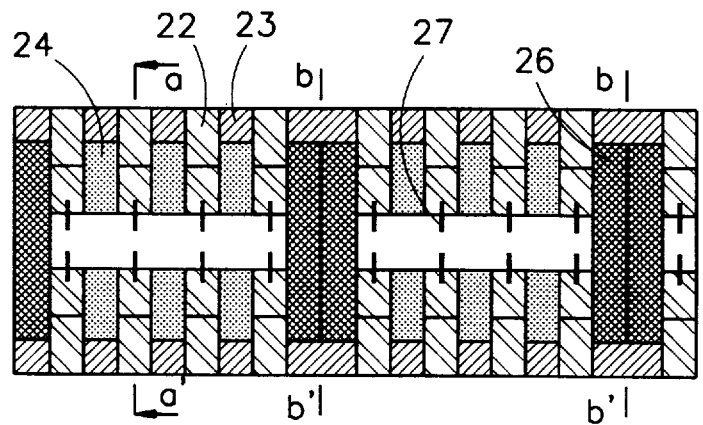
FIG. 3 is a plan view of a lead frame of an LOC package in accordance with the present invention.
Figure 4:
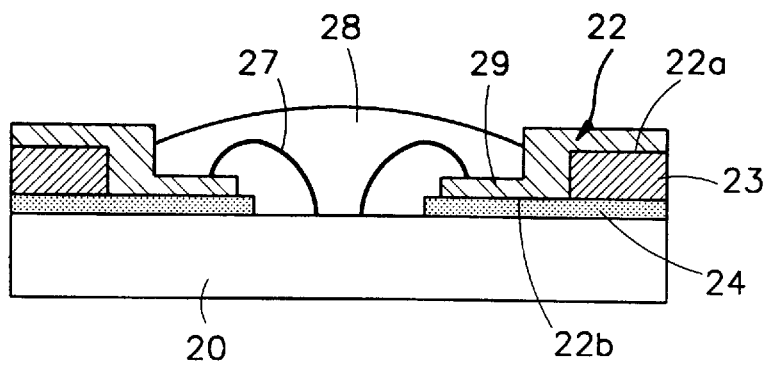
FIG. 4 is a cross-sectional view of the LOC package in accordance with the present invention.

A preferred embodiment of the present invention will now be described in detail with reference to the accompanying drawings. FIG. 3 is a plan view of an LOC package having removed coating fluid 28 from the LOC package in accordance with the embodiment of the present invention. As shown in FIG. 3, respective first two-sided tapes 24 and second two-sided tapes 23 differing in size are attached on predetermined portions of a lead frame 22. That is, the first two-sided tapes 24 and the second two-sided tapes 23 are attached by being formed as two layers so as to correspond to the form of the lead frame 22. Insulating films 26, which can be made of two-sided tapes, is attached to the semiconductor chip at two end portions of the semiconductor 20 in order to prevent flowing of a coating fluid 28 (not shown in FIG. 3) to adjacent semiconductor chip 20. The coating fluid 28 is shown in FIG. 4. Wires 27 are formed to connect a plurality of first portions 29 of the lead frame to a plurality of pads (not shown) of semiconductor chip 20, respectively. The line b-b' is a trim line to separate the LOC package. Description of the other structures of the LOC package which are similar to those of the conventional art is omitted here.

FIG. 4 is a cross-sectional view along the line of a-a' of FIG. 3 of the LOC package in accordance with the present invention, which includes, as its main components, the semiconductor chip 20; two first two-sided tapes 24 and second two-sided tapes 23 each being attached to predetermined portions of the semiconductor chip 20 in the form of layers; the lead frame 22 being formed to have a a step including a plurality of first portions and second portions and to be upwardly bent from first portions 29 to second portions corresponding to the forms of the respective first two-sided tapes 24 and second two-sided tapes 23; wires 27 for electrically connecting 29 of the lead frame 22 to bonding pads (not shown) of the semiconductor chip 20; and a coating fluid 28 covering the semiconductor chip 20, the first portions 29 of the lead frame 22 and the wires 27. The LOC package having such a construction as above has the following characteristics.

First, since the semiconductor chip has the same size as that of the lead frame 22, additional outer leads (not shown) are not necessary.

Secondly, there are provided the first two-sided tapes 24 and the second two-sided tapes 23 being attached to fit to the form of the lead frame 22.

Lastly, the package can be easily trimmed.

Furthermore, a method for fabricating the LOC package in accordance with the above embodiment of the present invention will now be described.

The lead frame 22 having a predetermined form for a chip size package as shown in FIG. 3 is fixed to a die (not shown). The second two-sided tape 23 is attached on a first base part 22a of the lead frame 22, and the first two-sided tapes 24 is attached on a second base part 22b of the lead frame 22. The first two-sided tapes 24 and the second two-sided tapes 23 have a partially mutually attached portion. The semiconductor chip 20 is attached on the first two-sided tape 24. In this respect, the first two-sided tape 24 is longer than the tape 23, so as to reliably attach the semiconductor chip 20. Thereafter, by using the similar method such as in the conventional art, the first portions 29 of the lead frame 22 and the pads (not shown) of the semiconductor chip 20 are electrically wired by a wire bonding process.

Thereafter, a potting step, an essential part of the method for fabricating the LOC package of the present invention, is performed, in which the coating fluid 28 is injected into the lead frame 22 to a predetermined height (that is, the height is lower than that of the lead frame 22) by using a nozzle (not shown). The coating fluid 28 is one selected from polyimide compounds.

Then, after the coating fluid 28 has hardened for a predetermined time, the insulating film 26 is trimmed along the line of b-b' in FIG. 3, so as to fabricate a predetermined LOC package.

According to the LOC package fabricated by performing the above process, there is no need for an additional tray because the resin sealing step for injecting an EMC (Epoxy Molding Compound) need not be performed. Also, since the outer size (chip size) of the lead frame is the same as that of the semiconductor chip, it can be constructed as a chip size package.

As so far described, according to the LOC package and its fabricating method of the present invention, the coating process is adopted rather than using a trimming/forming step and a resin molding step for the lead frame, so that its fabricating process can be simplified and the production cost for the package can be reduced. Also, since the lead frame of the LOC package is fabricated in a reel type, its package fabricating line can be easily made in-line in comparison with a strip manner such as in the conventional art.

What is claimed is:

1. An LOC semiconductor package comprising:
a semiconductor chip;
a plurality of two-sided tapes attached to the semiconductor chip;
a lead frame attached to the two-sided tapes;
a plurality of wires connecting the semiconductor chip to the lead frame; and
a coating fluid covering a portion of the semiconductor chip, a portion of the lead frame, a portion of the two-sided tapes, and the wires, wherein a height of the lead frame relative to the semiconductor chip is higher than the coating fluid.

2. The package according to claim 1, further comprising: a plurality of insulating films attached to two opposing ends of the semiconductor chip.

3. The package according to claim 1, wherein said coating fluid includes polyamide compound.

4. The package according to claim 1, wherein the lead frame includes a plurality of first portions and a plurality of second portions, wherein the first portions are attached to the two-sided tapes, and wherein the second portions are upwardly bent from said first portions.

5. The package according to claim 1, wherein an outer size of the lead frame is the same as an outer size of the semiconductor chip.

6. The package according to claim 2, wherein a height of the lead frame is higher than that of the insulating films relative to a top surface of the semiconductor chip.

7. The package according to claim 2, wherein the insulating films are formed of two-sided tapes.

8. The package according to claim 2, wherein the insulating films are attached to the plurality of two-sided tapes.

9. The package according to claim 4, wherein the two-sided tapes include a plurality of first and second two-sided tapes.

10. The package according to claim 9, wherein a width of the second two-sided tapes are narrower than that of the first two-sided tapes.

11. The package according to claim 9, wherein the first and second portions of the lead frame are attached to said first and second two-sided tapes, respectively.

12. The package according to claim 4, wherein a plurality of upper surfaces of said second portions of the lead frame are exposed.

13. The package according to claim 4, wherein the first portions are inner lead portions and the second portions are outer lead portions, wherein each of the inner lead portions includes an end portion connected to the semiconductor chip with one of the plurality of wires, and wherein the outer lead portions are upwardly bent from the inner lead portions and laterally extend to an outer end that is in the opposite direction to the inner lead portions.

14. An LOC semiconductor package comprising:
a semiconductor chip;
a plurality of two-sided tapes attached to the semiconductor chip, wherein the two-sided tapes include a plurality of first and second two-sided tapes, wherein the plurality of second two-sided tapes is attached on the first two-sided tapes and a width of the second two-sided tapes is narrower than that of the first two-sided tapes;
a lead frame attached to the two-sided tapes;
a plurality of wires connecting the semiconductor chip to the lead frame; and
a coating fluid covering a portion of the semiconductor chip, a portion of the lead frame, a portion of the two-sided tapes, and the wires, wherein the coating fluid is bounded by the second two-sided tapes.

15. A semiconductor package comprising:
a semiconductor chip;
a plurality of two-sided tapes attached to a first surface of the semiconductor chip;

a lead frame attached to the two-sided tapes over the first surface of the semiconductor chip;

a plurality of wires connecting the semiconductor chip to the lead frame;

a coating fluid covering a portion of the semiconductor chip, a portion of the lead frame, a portion of the two-sided tapes, and the wires, wherein the coating fluid is not over the entire first surface of the semiconductor chip; and a plurality of insulating films over the first surface of the semiconductor chip attached to two ends of the semiconductor chip, wherein the insulating films are adjacent opposing outer lead frames.

* * * * *